United States Patent [19]

Takahashi et al.

[11] Patent Number: 5,043,795
[45] Date of Patent: Aug. 27, 1991

[54] SEMICONDUCTOR DEVICE

[75] Inventors: Yoshikazu Takahashi; Katuhiro Endo; Fumiaki Kirihata; Hideaki Kakiki, all of Matumoto, Japan

[73] Assignee: Fuji Electric Co., Ltd., Kawasaki, Japan

[21] Appl. No.: 508,276

[22] Filed: Apr. 11, 1990

[30] Foreign Application Priority Data

Apr. 11, 1989 [JP] Japan .................................. 1-91089
Jun. 15, 1989 [JP] Japan .................................. 1-152566
Sep. 8, 1989 [JP] Japan .................................. 1-233627

[51] Int. Cl.⁵ .................... H01L 23/42; H01L 23/44; H01L 23/46
[52] U.S. Cl. ........................ 357/79; 357/74; 357/68
[58] Field of Search ..................... 357/68, 79, 74, 38, 357/65

[56] References Cited

U.S. PATENT DOCUMENTS

| 4,554,574 | 11/1985 | Wright | 357/74 |
| 4,719,500 | 1/1988 | Tokunoh | 357/38 |
| 4,775,916 | 10/1988 | Kouzuchi et al. | 361/388 |
| 4,953,004 | 8/1990 | Almenräder et al. | 357/79 |
| 4,956,696 | 9/1990 | Hoppe et al. | 357/79 |

Primary Examiner—Rolf Hille
Assistant Examiner—David Ostrowski
Attorney, Agent, or Firm—Brumbaugh, Graves, Donohue & Raymond

[57] ABSTRACT

Provided is a semiconductor device for power switching applications which utilizes a plurality of gate terminals provided in pressure contact with gate electrodes, the gate terminal/electrodes situated so as separate current flow therethrough at time of gate turn off into separate components, thereby reducing the transverse voltage drop of the gate electrode. In one embodiment, the invention is applied to a gate turn off (GTO) thyristor, and in another embodiment, towards a reverse conducting GTO thyristor.

12 Claims, 4 Drawing Sheets

SEMICONDUCTOR DEVICE

BACKGROUND OF THE INVENTION

The present invention relates to a semiconductor device in which gate electrodes are in contact with a plurality of regions of gate electrodes provided on a main surface of a semiconductor substrate.

As a semiconductor device having the above-described structure, a gate turn off (hereinafter referred to as "GTO") thyristor and a reverse conducting GTO thyristor which is composed of a GTO thyristor and a diode integrated on the same semiconductor substrate are known.

For example, as a gate electrode connecting structure in a GTO thyristor, a center gate structure, an intermediate ring gate structure, an outer peripheral ring gate structure, etc. are known.

FIG. 2 is a sectional view of an example of the center gate structure. In FIG. 2, on one main surface (upper surface) of a semiconductor substrate, separated cathode electrodes are provided and a gate electrode is disposed on the surface of the semiconductor substrate which is dug in such a manner as to surround all the cathode electrodes and prevent short-circuit. With the one main surface side, a cathode post 3 solely is in contact through a contact electrode plate 2 which comes into contact with only the cathode electrode plane protruding from the gate electrode plane, while an anode post 4 is in contact with the other main surface (undersurface) of the semiconductor substrate 1, both posts 3, 4 being integrally united by an insulating hermetic ring 31, thereby constituting a semiconductor device. The cathode post 3 is provided with a lead groove from the peripheral end portion toward the center, and in a hole formed at the center of the groove. One end of a gate lead 6 which is held by an insulating material 81 is in pressure contact with the gate electrode of the semiconductor substrate 1 through the hole provided at the center of the contact electrode plate 2, and the other end of the gate lead 6 is further connected to a gate lead pipe 7 so as to be lead out to the outside, thereby constituting a thyristor having a center gate structure.

FIG. 3 is a sectional view of an example of an intermediate ring gate structure. The structure of the device as a whole is similar to the structure shown in FIG. 2. The cathode post 3 is provided with an annular groove for pressure contact at a position corresponding to an intermediate portion between the center and the outer periphery of the semiconductor substrate 1. The contact electrode plate 2 is separated into a central discal portion and an outer annular portion at the groove by substantially the same separating width. An annular gate terminal 52 which is movably inserted into the groove of the cathode post 3 is brought into pressure contact with the gate electrode by an annular spring member 92 which is inserted into the bottom of the groove in contact therewith through an insulating plate 82. One end of the gate lead 6 is connected to the gate terminal 52, and the other end thereof is connected to the gate lead pipe, thereby constituting an intermediate ring gate structure.

FIG. 4 is a partially sectional view of the outer peripheral portion of an example of an outer peripheral ring gate structure. To an insulating block 32 provided on the inside of the insulating hermatic block, a conductive material 33 having a means for electrically connecting to the outside of the device is attached. One end of a spring-like gate terminal 53 is secured to the conductive material 33, and the other end thereof is brought into pressure contact with a ring gate electrode 34 on the outer periphery of the one main surface of the semiconductor substrate 1 by the action of the spring, thereby constituting an outer peripheral ring gate structure.

A reverse conducting GTO thyristor is composed of a GTO thyristor having a self arc extinguishing power and a fly-wheel diode are integrated on the same silicon wafer. This type of thyristor can reduce the size and weight of the device and produce high performance by the application of an inverter. FIG. 5 is a sectional view of the structure of an element of a reverse conducting GTO thyristor. The GTO portion 10 at the inner peripheral portion of the semiconductor substrate 1 is composed of a p emitter layer 11, an n base layer 12, a p base layer 13 and an n emitter layer 14 in the form of segments, and the diode portion 20 at the outer peripheral portion is composed of an n' layer 21, an n layer 22 and a p layer 23. The n layer 12 and the n layer 22, and the p layer 13 and the p layer 23 are connected to each other, respectively. Cathode electrodes 15 are provided on the surfaces of the n emitter layer 14 and the p layer 23, and cathode posts (not shown) are in pressure contact with the cathode electrode through contact electrode plates of molybdenum or the like, which has a thermal expansion coefficient approximate to that of silicon. Gate electrodes 16 are provided on the surfaces of the p base layer 13 which surround the segments of the n emitter layer 14. With a portion at the center of the element, a gate terminal (not shown) comes into pressure contact. An anode electrode 18 is provided on the surfaces of the p emitter layer 11 and the n' layer 21, and anode post (not shown) is in pressure contact with the anode electrode 18. A separation groove 19 is dug at the boundary of the GTO portion 10 and the diode portion 20 so as to electrically isolating the GTO portion and the diode portion from each other. It is necessary to apply a current to the gate electrodes 16 in order to turn on the GTO portion and to take a current from the gate electrodes 16 in order to turn off the GTO portions. Such a gate control is carried out through a gate electrode.

In FIG. 5, a center gate structure is shown, but the element may have an intermediate ring gate structure or an outer peripheral ring gate structure. In the case of an outer peripheral ring gate structure, the gate terminal, which is situated at the outermost periphery of the GTO portion, comes into contact with the gate electrodes on the inner side of the diode portion 20.

In a semiconductor device such as a GTO thyristor in which a large current temporarily flows on the gate electrode at the time of turn-off, it is desirable to make the contacting area of a gate electrode and a gate terminal or the like for taking out a current from the gate electrode as large as possible and connect them with the resistance lowest possible so as to reduce the transverse voltage drop which is caused when a current flows on the gate electrode as much as possible.

In a conventional gate electrode connection structure, in the case of a center gate structure shown in FIG. 2, since the gate current is only taken out of the contact portion at the end of the gate lead 6 at the center, the transverse voltage drop of the gate electrode layer between the contact portion at the end of the gate lead 6 and the outermost periphery of the semiconductor substrate 1 is limited by the thickness of the electrode layer so that the drop voltage becomes large. For example, if it is assumed the current flowing on the gate lead 6 is 100 A, the gate voltage reaches several hundred mV. As a result, it is impossible to make the gate turn-off uniform in plane, thereby involving a fear of causing turn-off breakage due to the concentration of current. In the case of an outer peripheral ring gate structure shown in FIG. 4, the contacting area of the gate electrode 34 and the gate terminal 53 is large, but the resistance produced when a current flows in the gate electrode layer is substantially the same as that in the case of a center gate structure, thereby involving a fear of causing turn-off breakage. In the case of an intermediate ring gate structure shown in FIG. 3, the annular gate terminal 52 is provided at an intermediate portion in the radial direction on the one main surface of the semiconductor substrate 1, and the contacting area with the gate electrode is considerably large. Since the resistance of the current in the gate electrode layer is as small as about ½ of the resistance in the case of the other structures, the transverse voltage drop of the gate electrode is reduced. However, since the annular gate electrode for bringing the annular gate terminal 51 into pressure contact is provided at an intermediate portion of the one main surface of the semiconductor substrate 1, the effective cathode area is reduced, so that the cathode current density is increased, thereby inconveniently increasing the forward voltage drop between the main electrodes.

Accordingly, it is an object of the present invention to eliminate the above-described problems in the prior art and to provide a semiconductor device provided with a gate electrode structure which is capable of reducing the transverse voltage drop of the gate electrode without reducing the effective area of a main electrode.

SUMMARY OF THE INVENTION

To achieve this aim, the present invention provides a semiconductor device for power switching applications comprising a semiconductor substrate, a first main electrode in electrical contact with a first main surface of the semiconductor substrate, and a second main electrode provided at a second main surface of the semiconductor substrate. A plurality of gate electrodes are disposed on the first main surface of the semiconductor substrate, comprising at least one gate electrode positioned in the vicinity of the inner portion of the first main electrode and at least one gate electrode positioned in the vicinity of the outer portion of the first main electrode. A plurality of gate terminals are in pressure contact with respect to the gate electrodes, and conductive means are provided for electrically connecting the gate terminals to a gate lead. Thus, the power capacity of the semiconductor device is enhanced by reduction of resistance to gate current flow as a result of the combined effect of the inner and outer gate terminals/gate electrodes combinations.

The present invention also provides a semiconductor device comprising: main electrodes provided on the respective main surfaces of a semiconductor substrate, one of the main electrodes being surrounded by gate electrodes and disposed on one of the main surfaces in a dispersed manner; and gate terminals in pressure contact with the respective gate electrodes at the regions closest to and farthest from the center of the surface of the substrate, each of the gate terminals being connected to a gate lead through a connecting conductor. The present invention also provides a semiconductor device applied to a reverse conducting GTO thyristor comprising: a GTO thyristor and a diode respectively provided at the central portion and the outer peripheral portion of the same semiconductor substrate so that the GTO thyristor and the diode are electrically isolated from each other by the separation groove which is dug in the surface of one of the main surfaces of the semiconductor substrate; segments of an emitter layer provided on the main surface of the GTO thyristor; an electrode provided on the surface of each of the segments, a post electrode which is brought into pressure contact with the electrode; a gate electrode provided on the surface of the base layer surrounding each of the segments; and gate terminals in pressure contact with the respective gate electrodes of the GTO thyristor at the regions closest to and farthest from the center of the surface of the substrate, wherein the pressuring mechanism of the gate terminal which comes into contact with the gate electrode at the region farthest from the center of the main surface of the substrate is provided at the portion of the post electrode which faces the separation groove.

Since the gate terminals which are connected to each other by a connecting conductor and are connected to a gate lead are brought into pressure contact with the gate electrodes at the regions closest to and farthest from the center of the semiconductor substrate, the gate current at the time of turn-off is uniformly taken out of the innermost peripheral portion and the outermost peripheral portion of the gate, so that the transverse voltage drop of the gate electrode is reduced, thereby preventing the turn-off breakage and improving the cutoff power. In addition, since the gate terminal is not in contact with the intermediate portion of the gate electrode, it is unnecessary to provide an annular gate electrode at the intermediate portion, thereby preventing the reduction in the effective area of the main electrode. In the case of a reverse conducting GTO thyristor, since the pressuring mechanism of the gate terminal which comes into contact with the gate electrode at the region farthest from the center of the main surface of the substrate is provided at the portion of the post electrode which faces the separation groove for the GTO thyristor and the diode, the conduction capacity corresponding to the substrate area is secured without reducing the areas of the GTO thyristor and the diode unavailingly.

DESCRIPTION OF THE PREFERRED EMBODIMENT

Embodiments of the present invention will be explained hereinunder with reference to the accompanying drawings.

Figure 1:
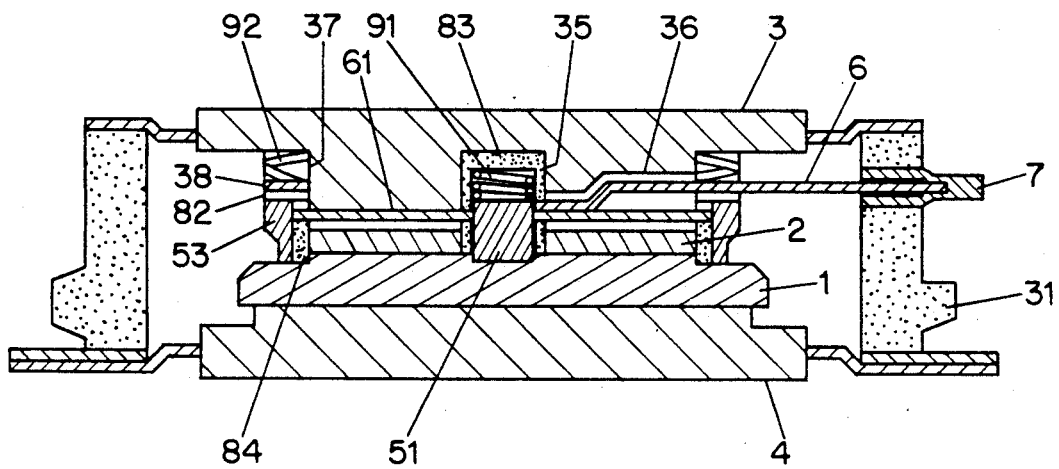
FIG. 1 is a sectional view of an embodiment of the present invention which is applied to a GTO thyristor.
Figure 2:
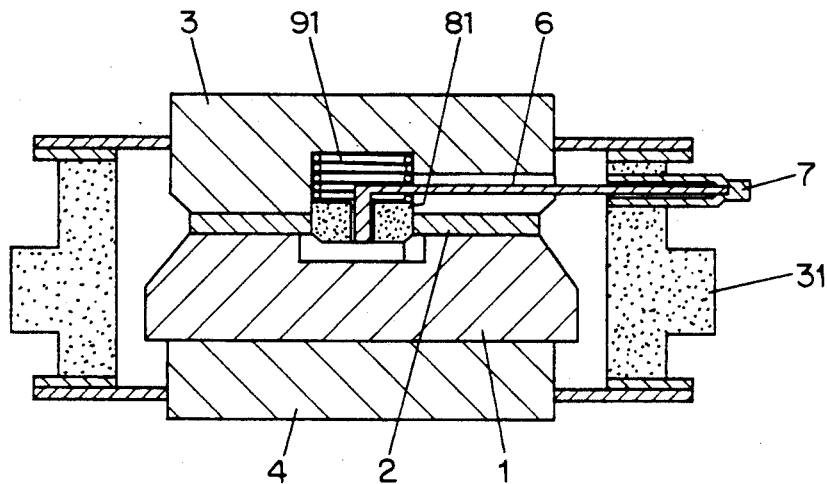
FIGS. 2, 3 and 4 are sectional views of different gate structures of conventional GTO thyristors.
Figure 3:
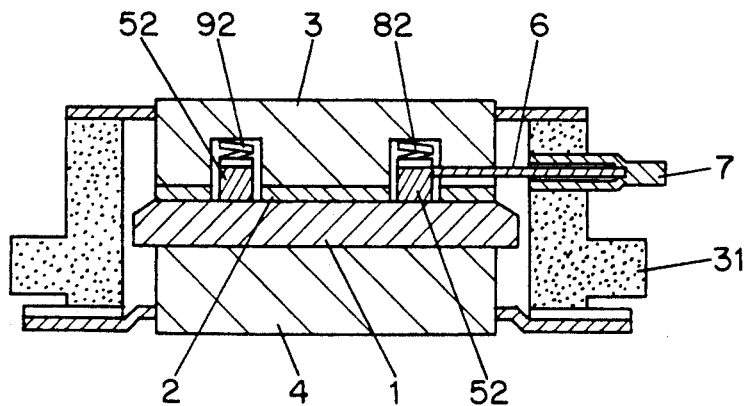
Figure 4:
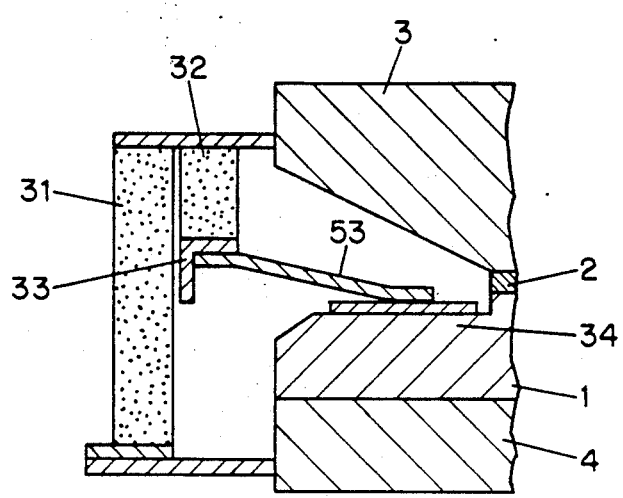

FIG. 1 is a sectional view of an embodiment of the present invention which is applied to a GTO thyristor. The same numerals are provided for the elements which are the same as those in the conventional device shown in FIGS. 2 to 4. This embodiment is greatly different from the conventional device in that gate terminals are brought into pressure contact with the gate regions at the central portion and the outer peripheral portion of the semiconductor substrate independently of each other, the gate terminal on the outer periphery and the gate terminal at the center are integrally connected by a connecting conductor as a gate terminal body, and a lead is connected to the gate terminal portion at the center so as to take out a current to the outside.

Figure 6:
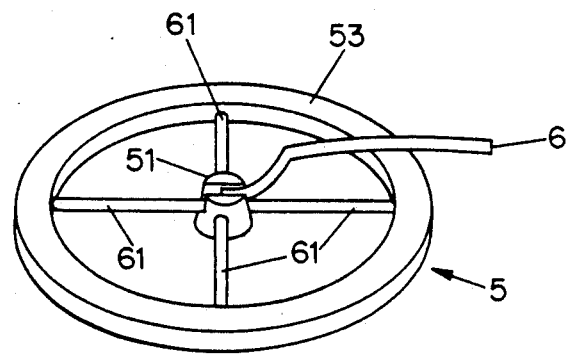
FIG. 6 is a perspective view of a gate terminal body used for the GTO thyristor shown in FIG. 1.

In the GTO thyristor shown in FIG. 1, a gate terminal body 5 produced in advance, as shown in the perspective view of FIG. 6 is used as an assembly member. In FIG. 6, to the central gate terminal 51 which is in contact with the gate region at the center, the annular peripheral gate terminal 53 which is in contact with the gate region on the outermost periphery is coaxially connected by a gate connecting conductor 61, and the lead 6 is further connected to the central gate terminal 51. The gate terminals 51, 53 have a thickness of 4 to 5 mm, and the end surfaces thereof have been subjected to nickel plating. The GTO thyristor shown in FIG. 1 is soldered to the insulating hermetic ring 31, and is provided with the cathode post 3 for mounting the gate terminal body 5 thereon. At the central portion of the first main electrode or cathode post 3 are provided a recessed portion 35 for receiving the central gate terminal 51 and a groove 36 through which the central gate terminal 51 is introduced to the gate lead pipe 7 and in which the gate lead 6 is inserted. At the peripheral portion of the cathode post 3, a stepped portion 37 is provided in correspondence with the annular peripheral gate terminal 53. Into the recessed portion 35 at the center of the cathode post 3 an insulating casing 83 made of a ceramic material or the like is inserted, and a spring member 91 is inserted into the insulating casing 83. At the stepped portion 37 are disposed an annular spring member 92, a spacer 38 and an insulating plate 82. The gate terminal 5 is mounted on the cathode post 3 such that the central gate terminal 51 is inserted in the insulating casing 83, the peripheral gate terminal 53 is supported by the stepped portion 37 through the insulating plate 82 and the gate lead 6 is inserted in the groove 36 with the end thereof fitted into the gate lead pipe 7. After the contact electrode plate 2, an insulating ring 84, the semiconductor substrate 1 and the anode post 4 are laminated in that order, the second main electrode or anode post 4 and the insulating hermetic ring 31 are hermetically welded by helium atmosphere arc welding or the like, thereby producing the GTO thyristor of this embodiment shown in FIG. 1. Since the central gate terminal 51 and the peripheral gate terminal 53 are brought into pressure contact with the gate electrode region at the center and the annular gate electrode region on the outermost periphery, respectively, by the spring member 91 and the annular spring member 92, respectively, a good contact state is obtained.

In this embodiment, the gate current at the time of turn-off is separated into a current which flows from the gate electrode region at the center to the central gate terminal 51 and a current which flows from the annular gate electrode region on the outermost periphery to the annular peripheral gate terminal 53 and is taken out by the closer terminal. Therefore, the resistance of the current in the route flowing within the gate is reduced to about ½ as compared with the resistance in a conventional center gate structure or an outer periphery gate structure. The current taken out by the central gate terminal 51 is introduced to the outside of the device through the gate lead 6 and the gate lead pipe 7. The current taken out by the annular peripheral gate terminal 53 is introduced to the outside through the closest gate connecting conductor 61, the gate lead 6 and the gate lead pipe 7. According to the structure of the gate terminal body of this embodiment, the gate current is taken out in a short route from the gate to the outside uniformly and at a low resistance, so that the transverse voltage drop of the gate electrode is small and the possibility of causing turn-off breakage is precluded, thereby improving the cut-off power. In addition, the effective cathode area is not reduced unlike in the conventional intermediate ring gate structure.

Figure 5:
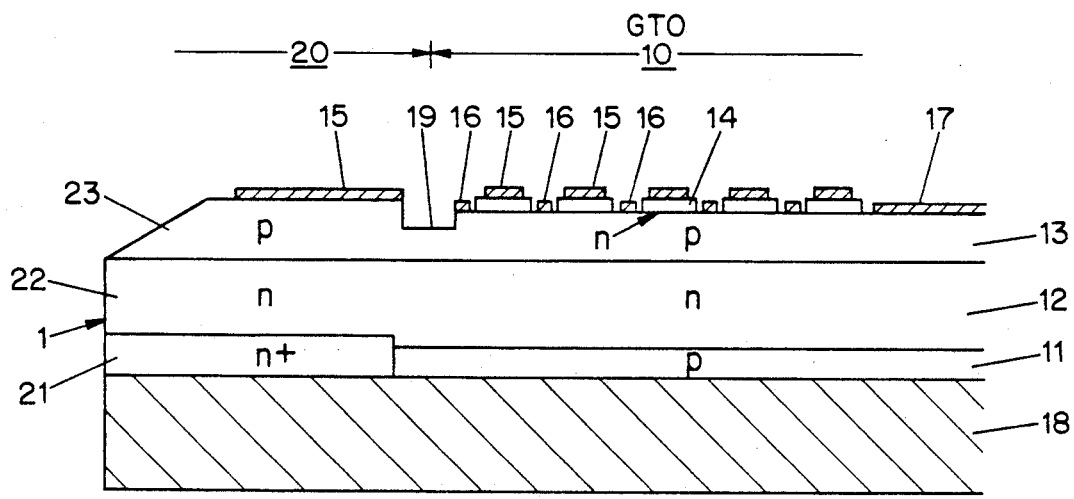
FIG. 5 is a sectional view of the main part of the structure of a reverse conducting GTO thyristor.
Figure 7:
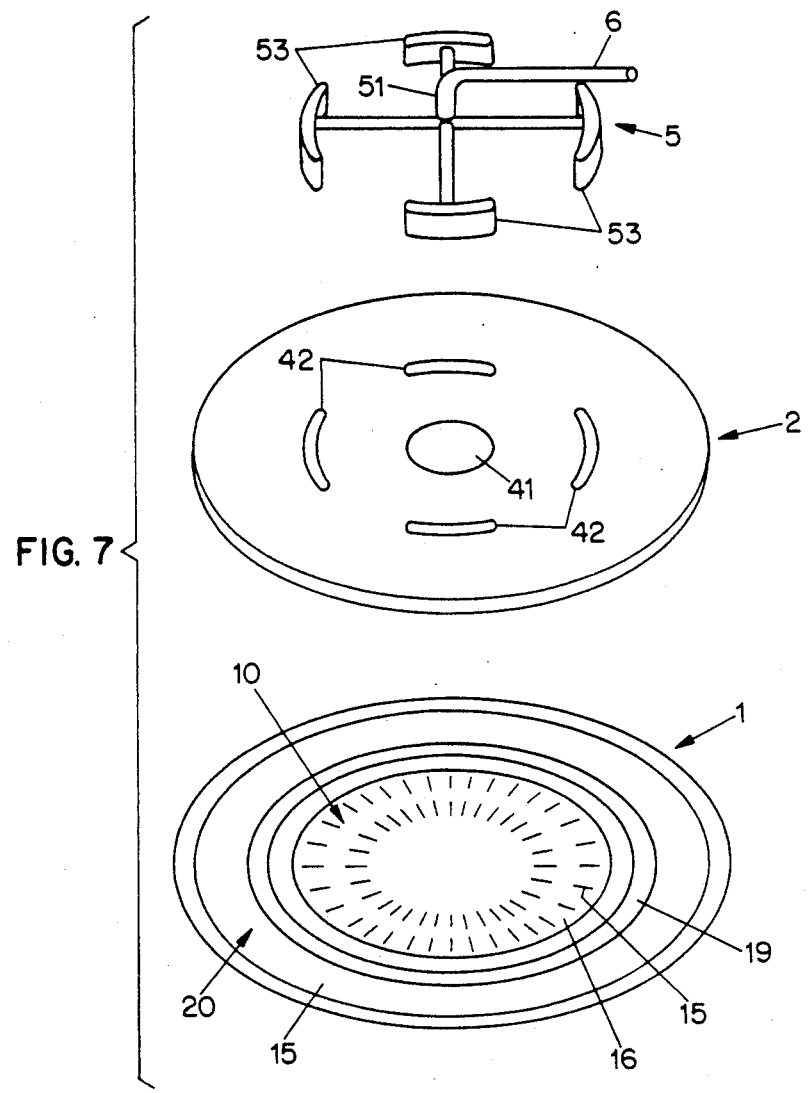
FIG. 7 is an exploded perspective view of another example of the present invention which is applied to a reverse conducting GTO thyristor.

FIG. 7 is an exploded view of another embodiment of the present invention which is applied to a reverse conducting GTO thyristor. The same numerals are provided for the elements which are the same as those shown in FIGS. 1, 5 and 6. The GTO portion 10 is provided at the inner peripheral portion of the semiconductor substrate 1, the diode portion 20 is provided at the outer peripheral portion and the separation groove 19 is provided therebetween in the same way as the thyristor shown in FIG. 5. The central gate terminal 51 and the peripheral gate terminal 53 of the gate terminal body 5 come into pressure contact with the gate electrode 16 of the GTO portion 10 at the center region and the annular peripheral region, respectively. In the contact electrode plate 2 made of Mo and having a thickness of 1.5 mm, a circular central window 41 and arcuate peripheral windows 42 are formed in order to pass the gate terminal 51 and the peripheral gate terminal 53. In this case, the peripheral gate terminal 53 is separated into four portions and four peripheral windows 42 are provided. If the peripheral gate terminal 53 is annular as shown in FIG. 6, the contact electrode plate 2 is divided into two plates. In order to apply a uniform pressure to the cathode electrodes of the GTO portion 10 and the diode portion 20, it is necessary to control the thicknesses of the two separated contact electrode plated by the difference in the order of several μm. This embodiment however is sufficed with only one contact electrode plate 2, as described above, thereby facilitating the production of the contact electrode plate having a plane accuracy of several μm. It goes without saying that the peripheral gate terminal 53 may be annular and the contact electrode plate 2 may be separated into two portions without leaving the spirit of the present invention.

Figure 8:
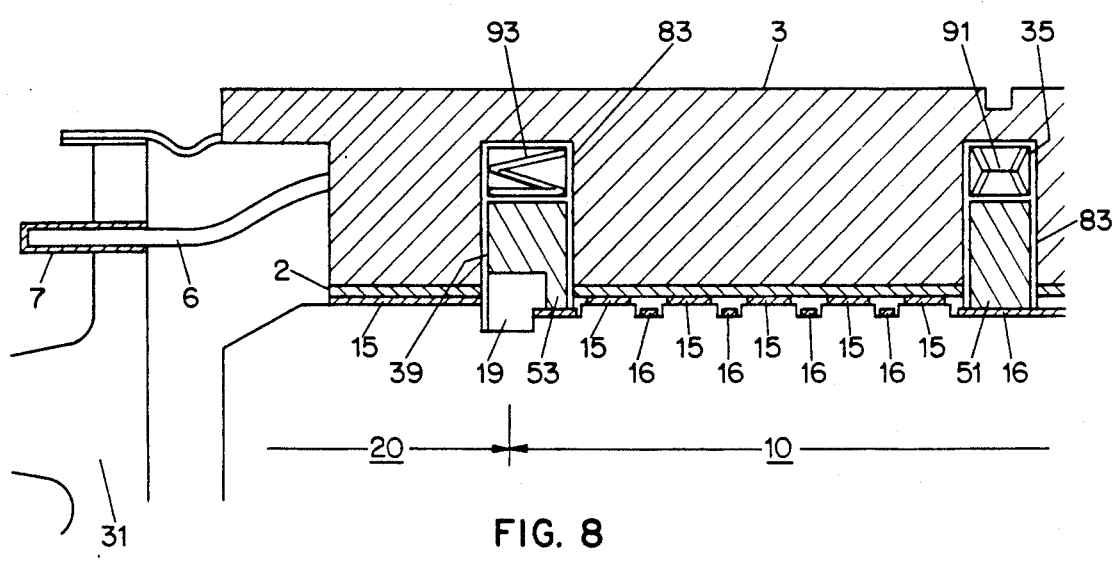
FIG. 8 is a sectional view of the main part of a pressure contacting mechanism of an embodiment of the present invention which is applied to a reverse conducting GTO thyristor.
Figure 9:
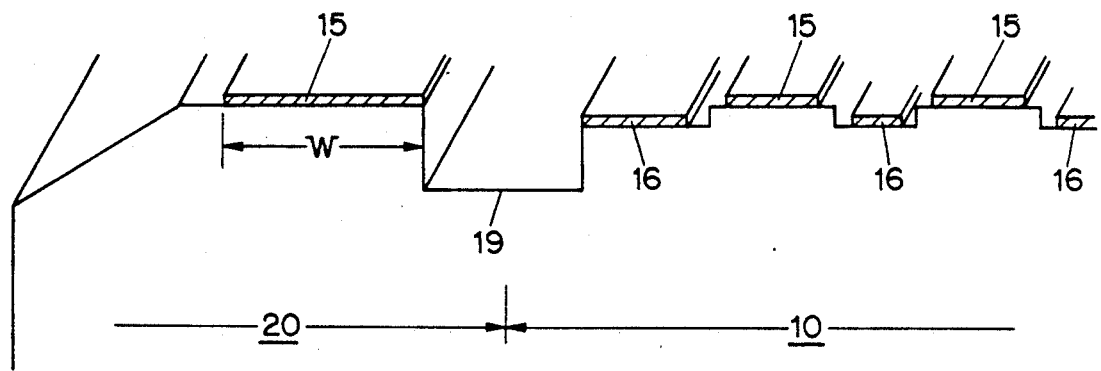
FIG. 9 is a perspective sectional view of the main part of a reverse conducting GTO thyristor element.

FIG. 8 is a sectional view of the pressure contacting mechanism of a reverse conducting GTO thyristor. The same numerals are provided for the elements which are the same as those shown in FIGS. 1 and 5. The cathode post 3 is brought into pressure contact with the cathode electrodes 15 of the GTO portion 10 and the diode portion 20 through the contact electrode plate 2. At the central portion of the cathode post 3, a cylindrical recessed portion 35 is formed and an arcuate recessed portion 39 is provided in such a manner as to face the separation groove 19 at the boundary of the GTO portion and the diode portion 20 on the surface of the silicon substrate. The cylindrical gate terminal 51 and the spring 91 are inserted in the recessed portion 35, and the gate terminal 51 is insulated from the cathode post 3 and the spring 91 by the insulating casing 83. In the recessed portion 39, the annular or arcuate gate terminal 53 is insulated from the cathode post 3 and the spring 93 by the insulating casing 83. The gate terminals 51, 53 are brought into pressure contact with the gate electrode 16 at the central portion and the outer peripheral portions, respectively, by the forces of the springs 91 and 93, respectively, and are connected to each other by a connecting conductor (not shown). The gate terminals 51, 53 are connected to the gate lead pipe 7 secured to the ceramic insulating hermetic ring 31 and the gate lead 6. In this structure, since the outer peripheral gate terminal 53 and the spring 93 pressing the gate terminal 53 are situated above the separation groove 19 between the GTO portion 10 and the diode portion 20, the contacting area of the cathode post 3 and the cathode electrode 15 through the contact electrode plate 2 is not influenced by these elements, and the conduction capacity through the cathode electrode is not reduced. FIG. 9 is a perspective sectional view of the vicinity of the separation groove 19 at the boundary of the GTO portion 10 and the diode portion 20 of a reverse conducting GTO thyristor element. The width w at which the gate electrode 16 is in contact with the gate terminal 53 is 2 to 3 mm, and the gate electrodes 16 surround a multiplicity of segments of n emitter layer arranged at the GTO portion 10.

Figure 10:
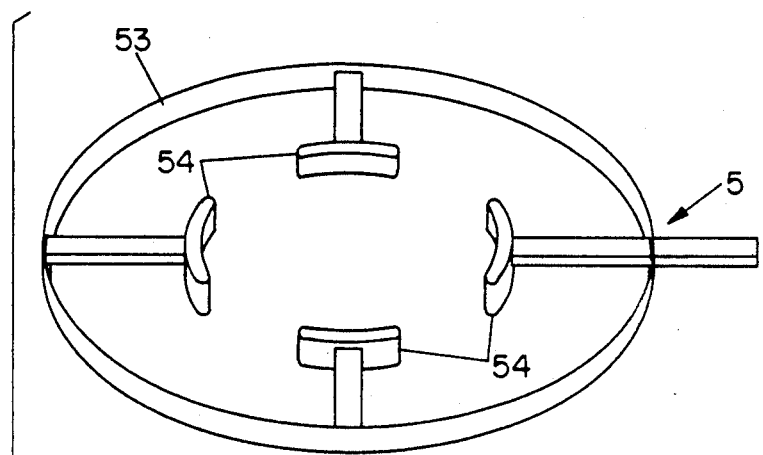
FIG. 10 is an exploded perspective view of still another embodiment of the present invention which is applied to a reverse conducting GTO thyristor.
Figure 10:
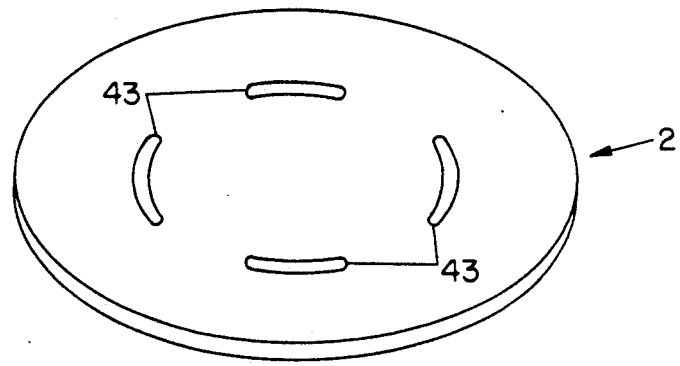
Figure 10:
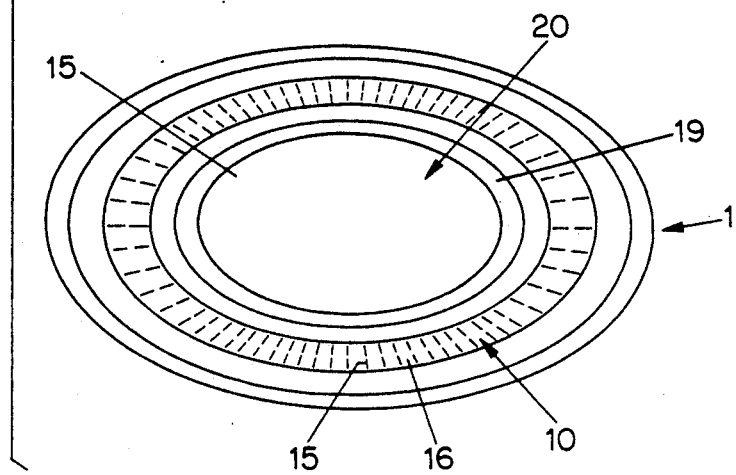

FIG. 10 shows still another embodiment of the present invention which is applied to a reverse conducting GTO thyristor. The same numerals are provided for the elements which are the same as those shown in FIG. 7. In this embodiment, since the GTO portion 10 is disposed at the outside of the diode portion 20 through the separation groove 19, the gate terminal body 5 is provided with the annular peripheral gate terminal 53 which is in contact with the annular outermost region of the gate electrode and four arcuate inner gate terminals 54 which is in contact with the annular innermost region. The contact electrode plate 2 has a smaller outer diameter than the inner diameter of the peripheral gate terminal 53 and is provided with four inside windows 43 through which the inner gate terminals 54 pass, so that there is no need to divide the contact electrode plate 2 into two members as in the embodiment shown in FIG. 7.

In the embodiments described above, a semiconductor device provided with a plurality of n emitter layers in which the cathode electrodes are surrounded by the gate electrodes is explained, but the present invention is also applicable to a semiconductor device provided with a plurality of p emitter layers in which anode electrodes are surrounded by the gate electrodes.

According to the present invention, by bringing gate terminals into contact with a gate electrode at the regions closest to and farthest from the center of a semiconductor device, respectively, and taking out a gate current from both regions, it is possible to take out a gate current from the gate electrode in a short route without reducing the effective area of the main electrode. As a result, a semiconductor device having gate to be electrically triggered such as a GTO thyristor and a reverse conducting GTO thyristor which is capable of reducing the transverse voltage drop of the gate electrode and preventing turn-off breakage and which has a high cut-off power is obtained. For example, it is possible to enhance the cut-off power of a semiconductor device according to the present invention which has the same conduction capacity as a conventional semiconductor device by about 30%.

We claim:

1. A semiconductor device for power switching applications comprising:
    a semiconductor substrate having opposed upper and lower surfaces;
    a first main electrode having inner and outer portions in electrical contact with said upper main surface of said semiconductor substrate;
    a second main electrode in electrical contact with said lower main surface of said semiconductor substrate;
    said upper surface of said semiconductor substrate having thereon at least a first gate region disposed near the outer portion of said first main electrode and at least a second gate region disposed near the inner portion of said first main electrode;
    a gate terminal body disposed between said first main electrode and the upper surface of said semiconductor substrate, said body comprising at least first and second gate terminals in pressure contact with said first and second gate regions, respectively;
    conductive means for electrically connecting said gate terminals to a gate lead;
    the combination of said gate terminal body and said gate regions reducing the resistance to gate current flow to thereby enhance the power handling capacity of the semiconductor device.

2. The semiconductor device of claim 1 in which one gate terminal is positioned at the outer periphery of said first main electrode and one gate terminal is positioned at the center of said first main electrode.

3. The semiconductor device of claim 2 in which the gate terminal positioned at the outer periphery of said first main electrode is annular and is connected to the gate terminal positioned at the center of said first main electrode by a plurality of leads.

4. The semiconductor device of claim 1 in which said first main electrode is a cathode and said second main electrode is an anode.

5. The semiconductor device of claim 1 in which a recess is provided at the center of said first main electrode for receiving said gate terminals.

6. The semiconductor device of claim 1 in which said pressure contact is achieved by spring means.

7. The semiconductor device of claim 1 in which an inner portion of said semiconductor is a gate turn-off thyristor, an outer peripheral portion of said semiconductor is a diode, and a separation groove is provided therebetween.

8. The semiconductor device of claim 1 further comprising an electrode plate disposed between said first and second main electrodes.

9. The semiconductor device of claim 8 in which there are included a plurality of gate terminals arcuate in shape and positioned at the outer periphery of said first main electrode and one gate terminal is positioned at the center of said first main electrode.

10. The semiconductor device of claim 1 in which one gate terminal is annular and is positioned at the outer periphery of said first main electrode, and a plurality of gate terminals are arcuate in shape and are connected to said annular gate terminal by a plurality of leads.

11. A gate turn off thyristor semiconductor device comprising:

a semiconductor substrate with opposed first and second sides;

an anode post provided on the first side of and in contact with said semiconductor substrate; a cathode post provided on the second side of said semiconductor substrate, said cathode post having a recessed portion;

a gate terminal body comprising an annular peripheral gate terminal, a central gate terminal located within said annular peripheral gate terminal and connected thereto by a plurality of gate connecting conductors, and a gate lead connected at one end to said central gate terminal, said gate terminal body disposed between said cathode post and said semiconductor substrate and in contact with a gate region of said semiconductor substrate having inner and outer portions;

spring means, disposed within said recessed portion of said cathode post at said central terminal of said gate terminal body and at said annular peripheral gate terminal of said gate terminal body, for pressuring said gate terminal body against said gate region of said semiconductor substrate;

whereby gate current, at the time of the device turn off, is separated into a current which flows from the gate region at the center to the central gate terminal and a current which flows from the outermost portion of said gate region to the annular peripheral gate terminal, thereby lowering the transverse voltage drop of the gate electrode.

12. The gate turn off thyristor semiconductor device of claim 11, wherein said annular peripheral gate terminal comprises a plurality of separated arcuate sections and the device additionally comprises an electrode plate disposed between the anode post and the cathode post and having a plurality of arcuate openings proportioned to enable said arcuate gate terminal sections to pass therethrough.

* * * * *